United States Patent
Otremba et al.

(10) Patent No.: US 9,478,484 B2
(45) Date of Patent: Oct. 25, 2016

(54) SEMICONDUCTOR PACKAGES AND METHODS OF FORMATION THEREOF

(71) Applicant: Infineon Technologies Austria AG, Villach (AT)

(72) Inventors: Ralf Otremba, Kaufbeuren (DE); Klaus Schiess, Allensbach (DE); Chee Voon Tan, Seremban (MY)

(73) Assignee: Infineon Technologies Austria AG, Villach (AT)

( * ) Notice: Subject to any disclaimer, the term of this patent is extended or adjusted under 35 U.S.C. 154(b) by 342 days.

(21) Appl. No.: 13/656,496

(22) Filed: Oct. 19, 2012

(65) Prior Publication Data

US 2014/0110828 A1   Apr. 24, 2014

(51) Int. Cl.
*H01L 23/495* (2006.01)
*H01L 23/00* (2006.01)
*H01L 23/31* (2006.01)

(52) U.S. Cl.
CPC ... *H01L 23/49562* (2013.01); *H01L 23/49524* (2013.01); *H01L 23/49548* (2013.01); *H01L 23/49568* (2013.01); *H01L 24/36* (2013.01); *H01L 24/40* (2013.01); *H01L 23/3107* (2013.01); *H01L 2224/32245* (2013.01); *H01L 2224/37147* (2013.01); *H01L 2224/40095* (2013.01); *H01L 2224/40245* (2013.01); *H01L 2924/12032* (2013.01); *H01L 2924/1301* (2013.01); *H01L 2924/13055* (2013.01); *H01L 2924/13062* (2013.01); *H01L 2924/181* (2013.01)

(58) Field of Classification Search
CPC .................................................. H01L 23/495

USPC ........................ 257/666, E23.031, E21.506
See application file for complete search history.

(56) References Cited

U.S. PATENT DOCUMENTS

| | | | |
|---|---|---|---|
| 6,144,093 A | 11/2000 | Davis et al. | |
| 6,521,982 B1 | 2/2003 | Crowley et al. | |
| 6,534,878 B1 | 3/2003 | Sander et al. | |
| 6,723,582 B2 * | 4/2004 | Glenn | H01L 23/49524 257/701 |
| 7,432,594 B2 * | 10/2008 | Ashida | H01L 21/566 257/735 |
| 7,659,611 B2 | 2/2010 | Otremba | |
| 7,663,211 B2 | 2/2010 | Noquil et al. | |
| 7,745,929 B2 | 6/2010 | Otremba | |

(Continued)

FOREIGN PATENT DOCUMENTS

| DE | 102005054872 A1 | 5/2007 |
|---|---|---|
| DE | 102005057401 B4 | 10/2009 |

(Continued)

OTHER PUBLICATIONS

Herbsommer, Juan A., "Novel Thermally Enhanced Power Package", Texas Instruments, Bethlehem, PA, Feb. 2010, 4 pages.

(Continued)

*Primary Examiner* — Matthew Landau
*Assistant Examiner* — Krista Soderholm
(74) *Attorney, Agent, or Firm* — Slater Matsil, LLP

(57) ABSTRACT

In accordance with an embodiment of the present invention, a semiconductor device includes a lead frame having a die paddle and a lead. A chip is disposed over the die paddle of the lead frame. The semiconductor device further includes a clip, which is disposed over the chip. The clip couples a pad on the chip to the lead of the lead frame. The clip also includes a heat sink.

24 Claims, 11 Drawing Sheets

(56) References Cited

U.S. PATENT DOCUMENTS

| | | |
|---|---|---|
| 7,768,105 B2 | 8/2010 | Cruz et al. |
| 7,880,280 B2 | 2/2011 | Otremba |
| 8,426,963 B2 | 4/2013 | Zeng et al. |
| 2004/0124435 A1 | 7/2004 | D'Evelyn et al. |
| 2006/0038265 A1 | 2/2006 | Oberlin et al. |
| 2008/0054449 A1 | 3/2008 | Hirler et al. |
| 2010/0133666 A1 | 6/2010 | Meyer-Berg et al. |
| 2010/0133670 A1* | 6/2010 | Liu et al. ................ 257/675 |
| 2010/0155913 A1* | 6/2010 | Madrid .................... 257/666 |
| 2010/0176508 A1* | 7/2010 | Herbsommer ...... H01L 23/4334 257/718 |
| 2010/0244213 A1 | 9/2010 | Nozaki |
| 2013/0001792 A1 | 1/2013 | Uno et al. |

FOREIGN PATENT DOCUMENTS

| | | |
|---|---|---|
| EP | 0882308 B1 | 2/2004 |
| WO | 9821751 A2 | 5/1998 |

OTHER PUBLICATIONS

"DualCool N-Channel NexFET Power MOSFETs", Texas Instruments CSD16325Q5C, Dec. 2009—Revised Apr. 2010, 11 pages.

LFPAK The Toughest Power-S08, NXP, <httm://www.nxp.com/documents/reflow_soldering/sot669_fr.pdf>,Release Date Dec. 2009, 12 pages.

* cited by examiner

SEMICONDUCTOR PACKAGES AND METHODS OF FORMATION THEREOF

TECHNICAL FIELD

The present invention relates generally to semiconductor devices, and more particularly to semiconductor packages and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

Packaging may be a cost intensive process because of the complexity of connecting multiple electrical connections to external pads while protecting these electrical connections and the underlying chips.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a lead frame comprising a die paddle and a first lead, and a chip disposed over the die paddle of the lead frame. The semiconductor device further comprises a clip disposed over the chip. The clip couples a first pad on the chip to the first lead of the lead frame and includes a heat sink.

In accordance with an embodiment of the present invention, a semiconductor device comprises a lead frame comprising a die paddle and a first lead, and a chip disposed over the die paddle of the lead frame. A clip is disposed over the chip. The clip is coupled to the first lead and to a first pad of the chip. The clip comprises a first portion having a first width, a second portion having a second width, and a third portion having a third width. The second portion is above the first portion, and the third portion is above the second portion.

In accordance with an embodiment of the present invention, a method of forming a semiconductor device comprises forming a clip by structuring a base material, attaching the clip to a chip, the clip including a heat sink, and attaching the chip and the clip to a lead frame.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor device in accordance with an embodiment of the present invention, wherein FIG. 1A illustrates a cross-sectional view and FIG. 1B illustrates a top view;

FIG. 4, which includes

FIG. 5, which includes

FIG. 6, which includes FIGS. 6A and 6B, illustrates a clip frame material for fabricating a clip in accordance with an embodiment of the present invention, wherein FIG. 6A illustrates a cross-sectional view and FIG. 6B illustrates a top view;

FIG. 9, which includes FIGS. 9A and 9B, illustrates a clip frame during fabrication in accordance with an embodiment of the present invention, wherein FIG. 9A illustrates a cross-sectional view and FIG. 9B illustrates a top view;

FIG. 10, which includes FIGS. 10A and 10B, illustrates a clip frame during fabrication in accordance with an embodiment of the present invention, wherein FIG. 10A illustrates a cross-sectional view and FIG. 10B illustrates a top view;

FIG. 14, which includes

Corresponding numerals and symbols in the different figures generally refer to corresponding parts unless other-

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In various embodiments, the present invention teaches forming semiconductor packages using very low cost processes thereby dramatically reducing the cost of packaging semiconductor devices. As will be described in detail, in various embodiments, as much as possible, multiple process steps are combined to reduce manufacturing costs. Accordingly embodiments of the invention use a clip that functions also as a heat sink thereby eliminating the need for a separate heatsink. Embodiments of the invention may also avoid wire bonding and other processes.

A structural embodiment of a semiconductor package will be described using FIG. 1. Further structural embodiments will be described using FIGS. 2-5 and 13, and 14. A method of fabricating the semiconductor package in accordance with an embodiment of the invention will be described using FIGS. 6-13 and 14.

Figure 1A:
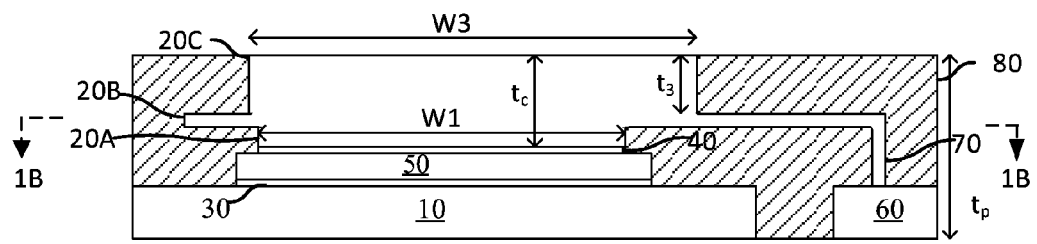
Figure 1B:
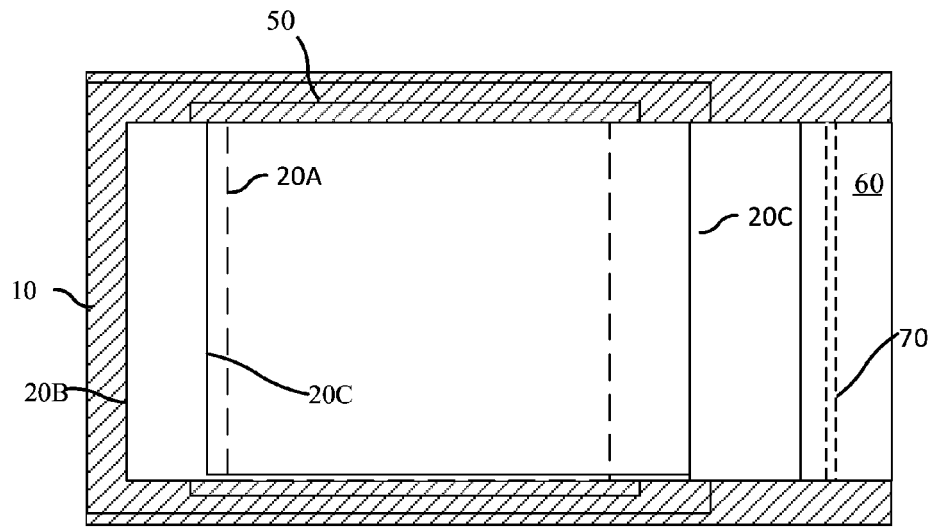

FIG. 1, which includes FIGS. 1A and 1B, illustrates a semiconductor device in accordance with an embodiment of the present invention, wherein FIG. 1A illustrates a cross-sectional view and FIG. 1B illustrates a top view.

Referring to FIG. 1A, the semiconductor package comprises at least one die 50 embedded within an encapsulating material 80. The die 50 is disposed over a lead frame 10, which has a plurality of leads 60 for contacting the semiconductor package. A clip 20 is disposed over the die 50 and embedded within the encapsulating material 80.

In various embodiments, the clip 20 has a first portion 20A, a second portion 20B, and a third portion 20C. In various embodiments, the first portion 20A is configured to contact a contact pad on the die 50. In various embodiments, the first portion 20A may have a first width correlated to the width of the die 50, the second portion 20B may have a second width for the contacting the plurality of leads 60 of the leadframe 10. Similarly, the third portion 20C may have a third width independent of the first width and the second width. The third width may be configured to efficiently remove heat away from the die 50. In other words, the third portion 20C is configured to act like a heat sink. Thus, in various embodiments, heat generated within the die 50 may be removed efficiently from the top surface and an opposite surface of the semiconductor package.

The die 50 is attached to the leadframe 10 using a first adhesive layer 30, which may be any suitable material that fixes the die 50 to the leadframe 10. The first adhesive layer 30 may be a conductive adhesive allowing contact to the back side of the die 50. For example, the back side of the die 50 may include a contact pad for coupling the die 50. The die 50 may also have one or more contact pads on the front side. The die contact pads may comprise a conductive material and may comprise gold, tin, copper, aluminum, silver, nickel, platinum, and combinations thereof.

The clip 20 is attached to the die 50 using a second adhesive layer 40, which may comprise a conductive layer.

In one or more embodiments, the first adhesive layer 30 and the second adhesive layer 40 may comprise a polymer such as a cyanide ester or epoxy material and may comprise silver particles. In one embodiment, the first adhesive layer 30 and the second adhesive layer 40 may comprise a composite material comprising conductive particles in a polymer matrix. In an alternative embodiment, the first adhesive layer 30 and the second adhesive layer 40 may comprise a conductive nano-paste. Alternatively, in another embodiment, the first adhesive layer 30 and the second adhesive layer 40 comprise a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the first adhesive layer 30 and the second adhesive layer 40.

In various embodiments, the thickness of the heat sink portion $t_3$ is at least 30% the thickness of the package $t_p$. In one or more embodiments, the thickness of the heat sink portion $t_3$ is about 30% to about 70% of the thickness of the package $t_p$. In one or more embodiments, the thickness of the heat sink portion t3 is about 40% to about 70% of the thickness of the package $t_p$. In one or more embodiments, the thickness of the heat sink portion t3 is about 30% to about 80% of the thickness of the clip 20 $t_c$. In one or more embodiments, the thickness of the heat sink portion t3 is about 50% to about 80% of the thickness of the clip 20 $t_c$.

A top sectional view of the semiconductor package is illustrated in FIG. 1B. As illustrated in FIG. 1B, the clip is visible on the top surface of the semiconductor package. The clip 20 extends from over the die 50 to the lead 60.

Thus, in various embodiments, the clip 20 includes a heat sink portion, which is exposed. For example, the exposed surface of the third portion 20C may be coupled to another heat sink structure or externally cooled, for example, using a fan.

Advantageously, in various embodiments, the die 50 is coupled to the heat sink portion of the clip 20 without additional barrier layers. In other words, the heat sink is integrated into the clip 20. For example, if the heat sink were attached separately to the clip, an intermediate bonding layer may be needed to attach the external heat sink with the clip. The intermediate bonding layer may be a thermal barrier reducing the effectiveness or efficiency of heat removal.

Further, as will be described below, embodiments of the invention reduce production costs by integrating the heat sink with the package interconnect.

Figure 2:
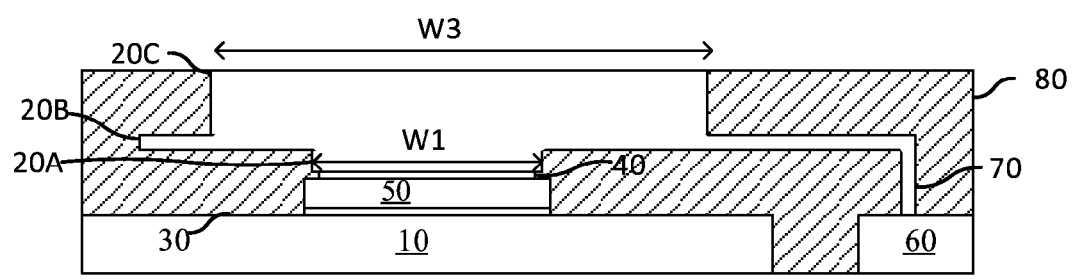
FIG. 2 illustrates an alternative embodiment of the semiconductor package comprising a die of a different dimension.

FIG. 2 illustrates an alternative embodiment of the semiconductor package comprising a die of a different dimension.

As illustrated in FIG. 2, embodiments of the invention may be applied to dies of different sizes. Consequently, the package dimensions such as a package size, pad size, and number of pads may be maintained across different packages although the die size may be different. For example, the third width W3 of the third portion 20C of the clip 20 illustrated in FIG. 1A is about the same as the third width W3 of the third portion 20C of the clip 20 illustrated in FIG. 1A. However, the first width W1 of the first portion 20A in FIG. 2 may be less than the first width W1 of the first portion 20A in FIG. 1A. Thus, advantageously, the manufacturer may vary the chip size (for example, scale chips) without involving the end user because the package size is constant.

Figure 3:
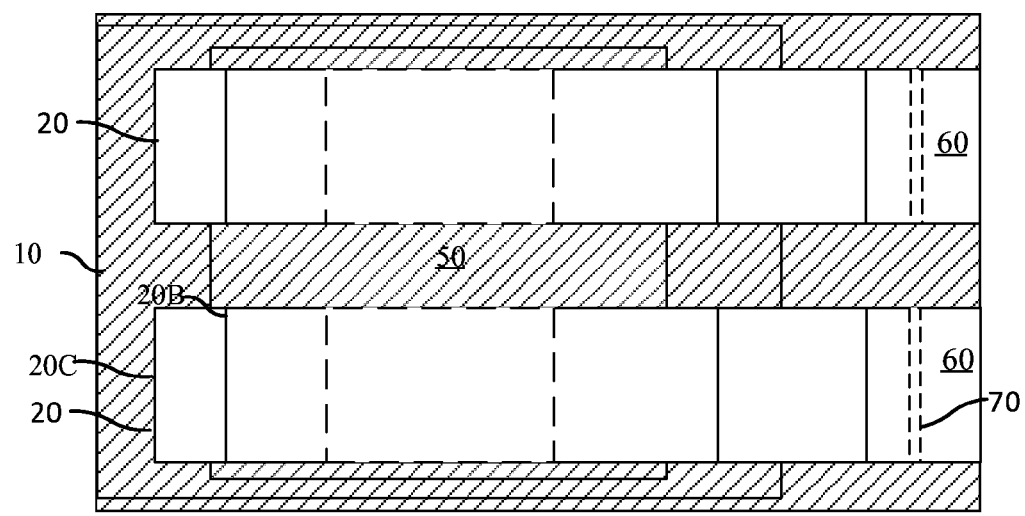
FIG. 3 illustrates a semiconductor package comprising a plurality of clips in accordance with an embodiment of the present invention.

FIG. 3 illustrates a semiconductor package comprising a plurality of clips in accordance with an embodiment of the invention.

In this embodiment, a plurality of clips 20 may be attached to the die 50. Accordingly, each clip may be coupled to a different contact pad on the die 50 and to a different lead 60 of the lead frame 10. Thus, embodiments of the invention may be used in contacting dies 50 having a plurality of contact pads.

Figure 4A:
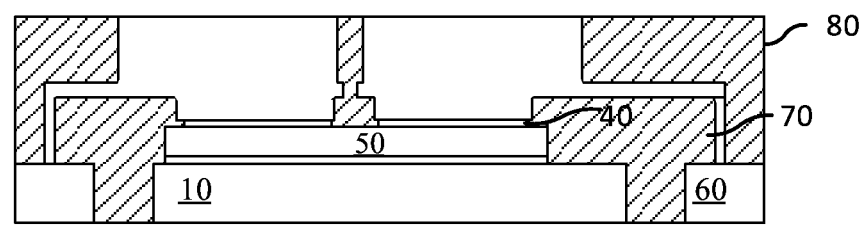
FIGS. 4A and 4B, illustrates a semiconductor package comprising a plurality of clips in accordance with an alternative embodiment of the present invention.
Figure 4B:
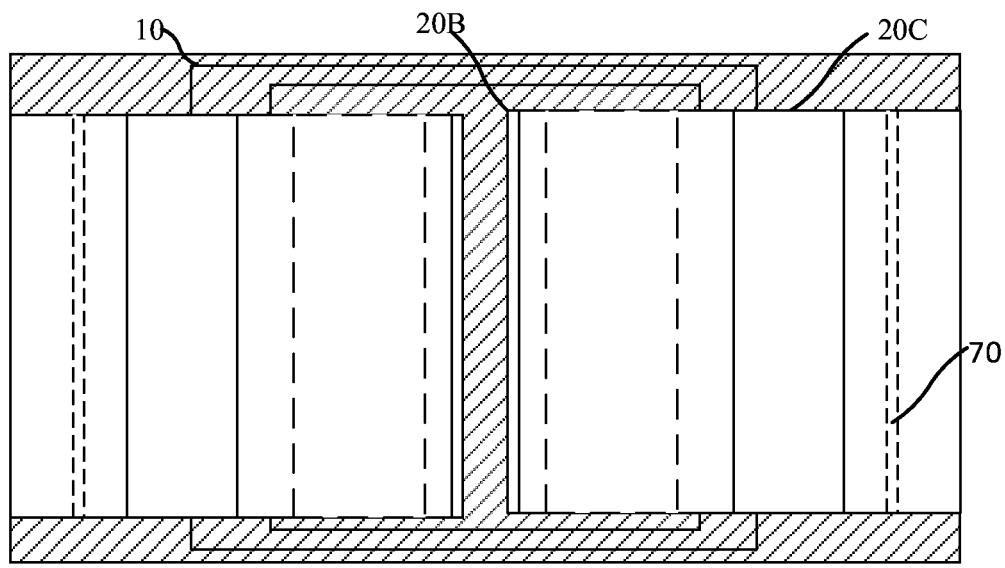

FIG. 4, which includes FIGS. 4A and 4B, illustrates a semiconductor package comprising a plurality of clips in accordance with an alternative embodiment of the present invention.

In this embodiment, the plurality of clips 20 is arranged so as to contact leads on opposite sides of the die paddle. In contrast, in FIG. 3, the plurality of clips 20 is arranged so as to contact leads 60 on the same side of the die paddle.

Figure 5B:
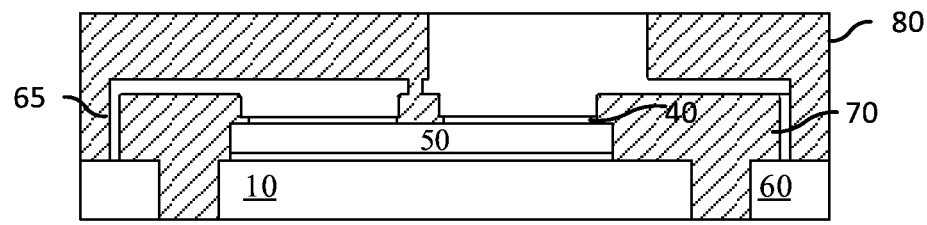
FIGS. 5A and 5B, illustrates a further embodiment of a semiconductor package including wire bonds to couple other contact pads of the die.
Figure 5A:
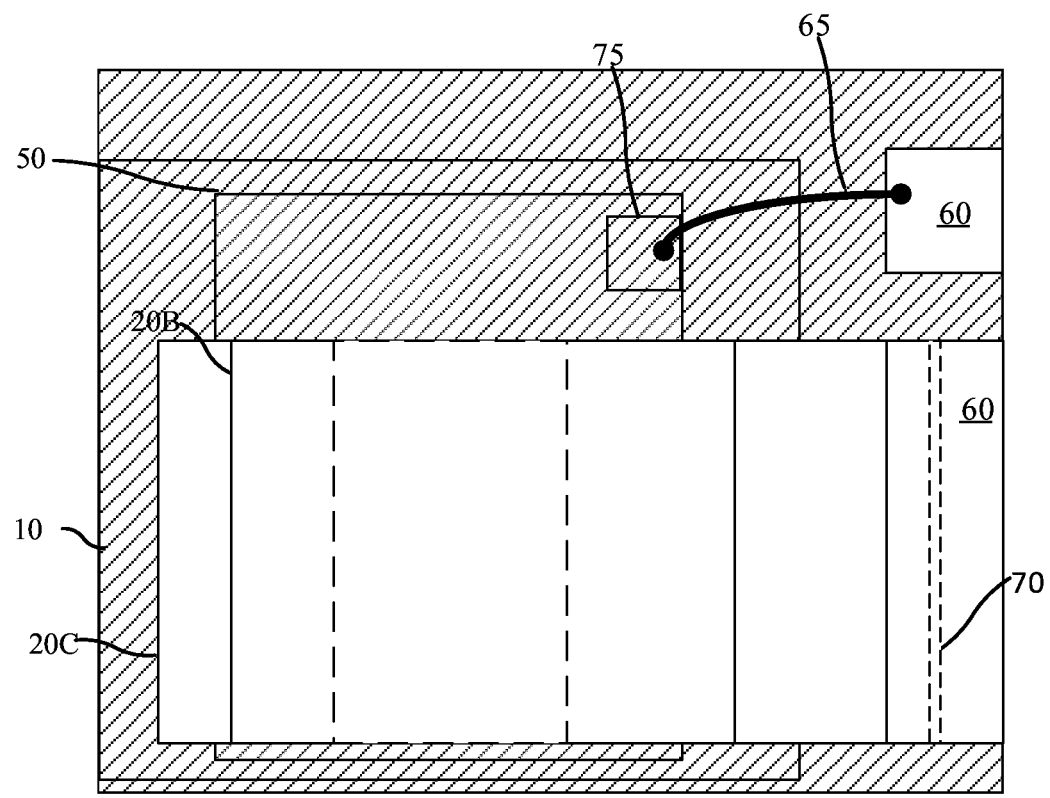

FIG. 5, which includes FIGS. 5A and 5B, illustrates alternative embodiments of a semiconductor package including interconnects to couple other contact pads of the die.

In various embodiments, the clip 20 with the integrated heat sink may be used only over the contact pads that draw larger currents and therefore heat up. For example, a gate contact 75 of the die 50 comprising a discrete transistor having a source contact, a drain contact, and the gate contact 75 may not need a heat sink. Using a common heat sink will short the drain with the gate of the transistor. The source or drain contact pad is coupled through the clip 10 as described in prior embodiments. The gate contact 75 of the die 50 may be coupled through an interconnect 65 to a lead 60 of the lead frame 10. In the embodiment illustrated in FIG. 5A, the interconnect 65 comprises a wire bond. In one or more embodiments, the wire bonds may comprise aluminum or copper. The thickness of such aluminum wires may be about 10 μm to about 1000 μm in one or more embodiments. In another embodiment, the wire bonds may comprise gold. The thickness of such gold wires may be about 10 μm to about 100 μm.

In the alternative embodiment illustrated in FIG. 5B, the interconnect 65 comprises a clip. In further embodiments, the interconnect 65 may comprise other type of interconnects. However, in this embodiment, the interconnect 65 comprising the clip may not include a heat sink portion.

FIGS. 6-13 illustrate a semiconductor package during various stages of fabrication.

Figure 6A:
Figure 6B:
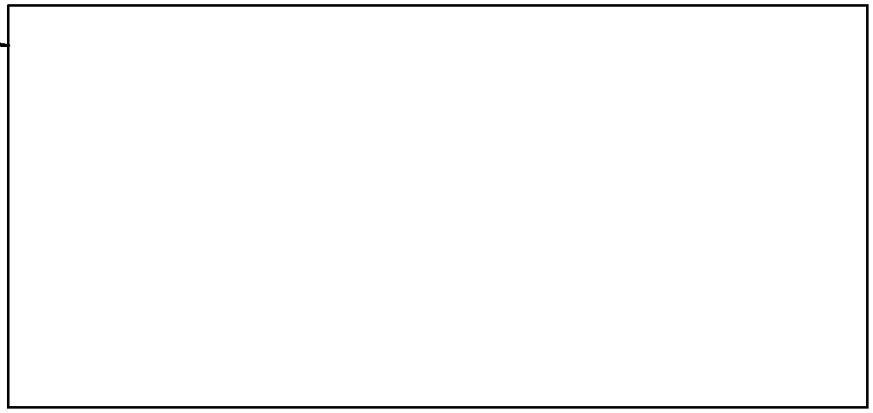

FIG. 6, which includes FIGS. 6A and 6B, illustrates a clip frame material for fabricating a clip in accordance with an embodiment of the present invention. FIG. 6A illustrates a cross-sectional view and FIG. 6B illustrates a top view.

The clip frame material 21 comprises a conductive material in various embodiments. In one or more embodiments, the clip frame material 21 comprises copper, which may include pure copper that may contain trace impurities or copper alloys. Examples of clip frame material 21 include copper, copper-aluminum, copper alloyed with nickel, iron, zinc, silicon, and others such as C19400, C70250, C19210. In some embodiments, the clip frame material 21 may be comprised of a plurality of layers of different materials, for example, an outer high conductivity layer comprising relatively pure copper while comprising an inner layer of alloyed copper or other materials designed to provide mechanical stability. Pure metals such as pure copper may include trace impurities in various embodiments. In various embodiments, the clip frame material 21 is the same material as a lead frame material.

Figure 7:
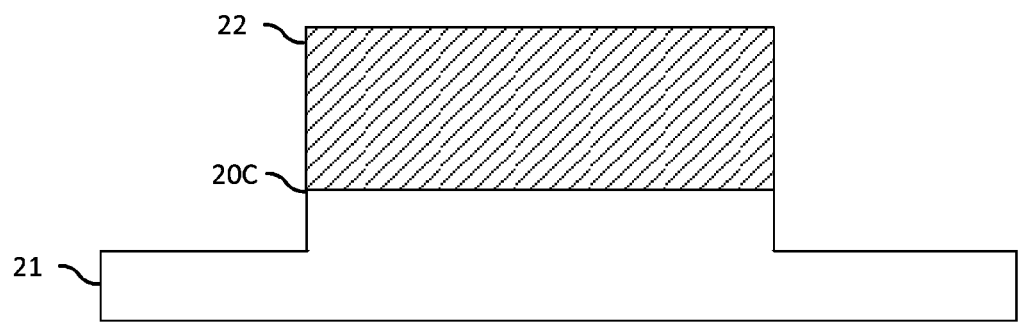
FIG. 7 illustrates a clip frame during fabrication after patterning a first side of the clip frame material in accordance with an embodiment of the present invention.

FIG. 7 illustrates a clip frame during fabrication after patterning a first side of the clip frame material in accordance with an embodiment of the present invention.

A first side of the clip frame material 21 is structured as illustrated in FIG. 7. In one or more embodiments, a first photo resist material 22 is deposited over a first side of the clip frame material 21. The first photo resist material 22 may be developed using a lithography process. The clip frame material 21 may be patterned using the first photo resist material 22 as a etch mask in one embodiment. In another embodiment, other structuring methods such as stamping may be used.

Figure 8:
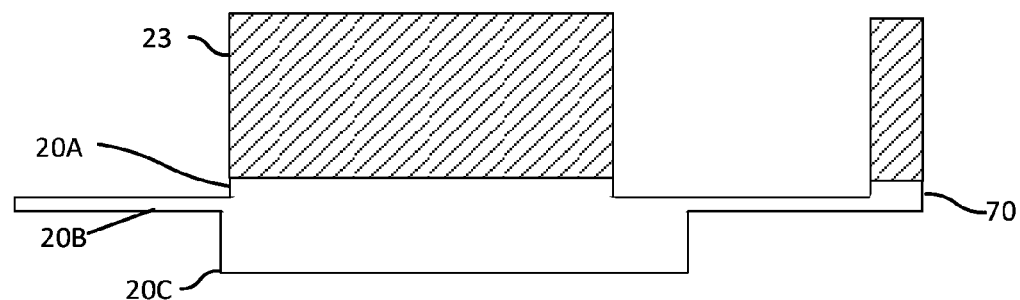
FIG. 8 illustrates a clip frame during fabrication after patterning an opposite second side of the clip frame material in accordance with an embodiment of the present invention.

FIG. 8 illustrates a clip frame during fabrication after patterning an opposite second side of the clip frame material in accordance with an embodiment of the present invention.

A second side of the clip frame material 21 is structured as illustrated in FIG. 8. In one or more embodiments, a second photo resist material 23 is deposited over the opposite second side of the clip frame material 21. The second photo resist material 23 may be developed using a lithography process. The clip frame material 21 may be patterned using the second photo resist material 23 as a etch mask in one embodiment. In another embodiment, other structuring methods such as stamping may be used.

Figure 9A:
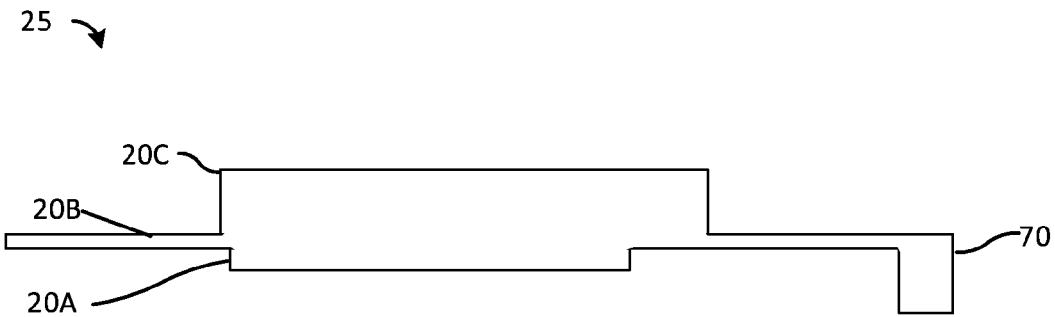
Figure 9B:
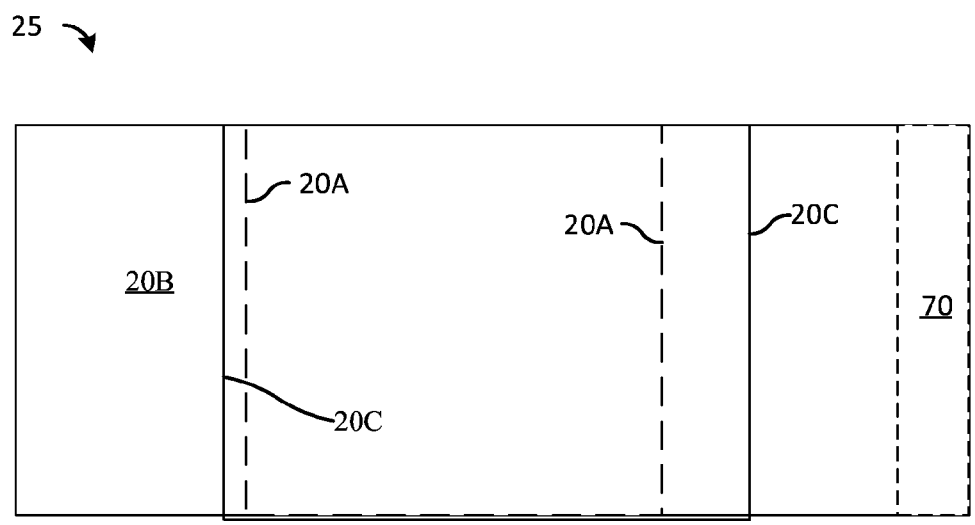

FIG. 9, which includes FIGS. 9A and 9B, illustrates a clip frame during fabrication in accordance with an embodiment of the present invention. FIG. 9A illustrates a cross-sectional view and FIG. 9B illustrates a top view.

As illustrated in FIG. 9A, the clip frame material 21 is structured to form a clip frame 25. As described above, the clip frame 25 may be formed by etching the clip frame material 21 from the top side and the opposite bottom side in one embodiment. Any remaining first photo resist material 22 and second photo resist material 23 are removed to form the clip frame 25.

Figure 10A:
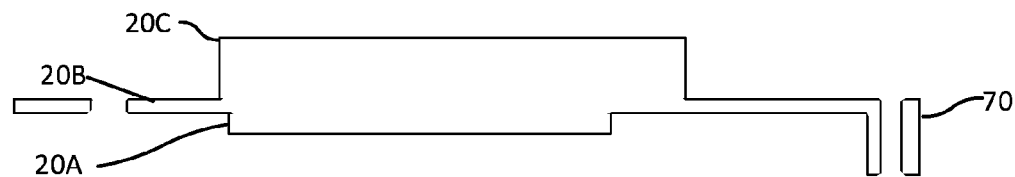
Figure 10B:
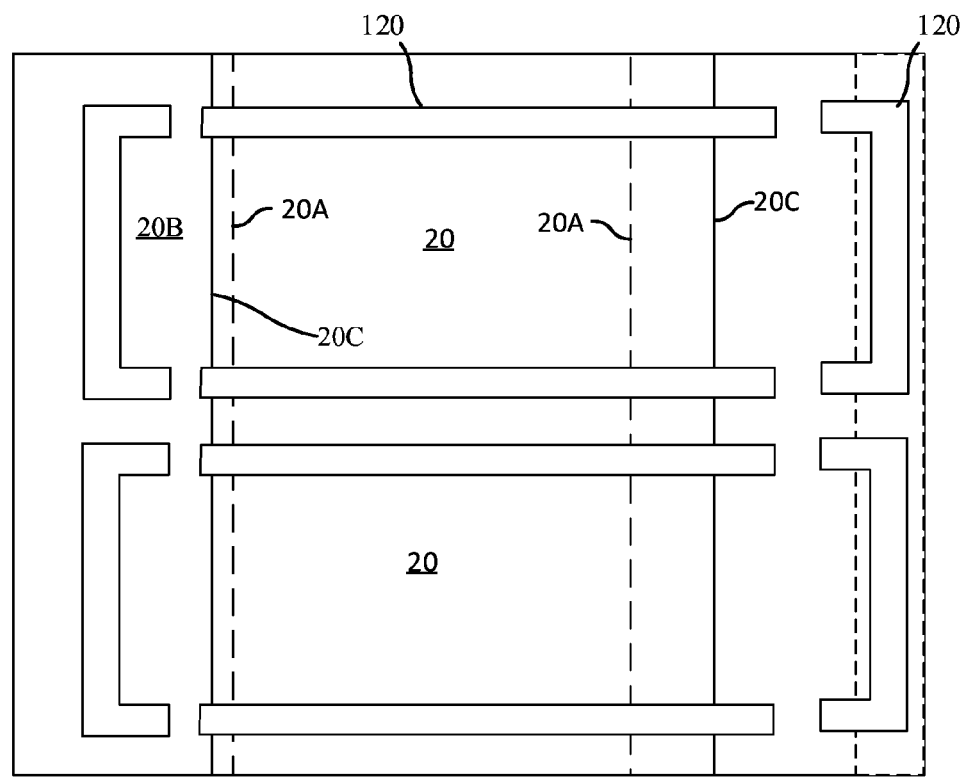

FIG. 10, which includes FIGS. 10A and 10B, illustrates a clip frame during fabrication in accordance with an embodiment of the present invention. FIG. 10A illustrates a cross-sectional view and FIG. 10B illustrates a top view.

Referring to FIG. 10A, the clip frame 25 is stamped to form clips 20. During stamping, regions of the clip frame material 21 are removed through the entire thickness of the clip frame material 21 thereby forming through holes 120. In some embodiments, an etching process may be used instead of a stamping process to form the through holes 120.

After stamping, the clip frame 25 may be singulated to form individual clips 20. For example, the clip frame 25 may be singulated by applying pressure. In another embodiment, a mechanical process may be used to saw through the clip frame 25 to form the singulated clips 20. For example, in some embodiments, the stamping process may even be skipped and the clip frame 25 may be directly singulated.

Figure 11:
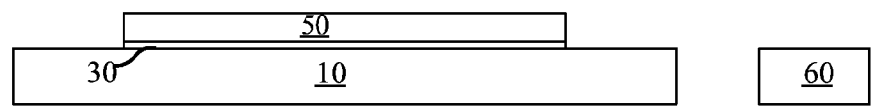
FIG. 11 illustrates a die attached to a lead frame during fabrication of the semiconductor package in accordance with an embodiment of the present invention.

FIG. 11 illustrates a die attached to a lead frame during fabrication of the semiconductor package in accordance with an embodiment of the present invention.

Using conventional processing, for example, a wafer may be diced to form a plurality of dies 50. The die 50 may be formed on a silicon substrate such as a bulk silicon substrate or a silicon on insulator (SOI) substrate. Alternatively, the die 50 may be a device formed on silicon carbide (SiC). Embodiments of the invention may also include devices formed on compound semiconductor substrates and may include devices on hetero-epitaxial substrates. In one embodiment, the die 50 is a device formed at least partially on gallium nitride (GaN), which may be a GaN on sapphire or silicon substrate.

In various embodiments, the die 50 may comprise a power chip, which, for example, draw large currents (e.g., greater than 30 amperes). In various embodiments, the die 50 may comprise a discrete vertical device such as a two or a three terminal power device. Examples of the die 50 include PIN or Schottky diodes, MISFET, JFET, BJT, IGBT, or thyristor.

In various embodiments, the die 50 may be a vertical semiconductor device configured to operate at about 20 V to about 1000 V. In one embodiment, the die 50 may be configured to operate at about 20 V to about 100 V. In another embodiment, the die 50 may be configured to operate at about 100 V to about 500 V. In yet another embodiment, the die 50 may be configured to operate at about 500 V to about 1000 V. In one embodiment, the die 50 may be an NPN transistor. In another embodiment, the die 50 may be a PNP transistor. In yet another embodiment, the die 50 may be an n-channel MISFET. In a further embodiment, the die 50 may be a p-channel MISFET. In one or more embodiments, the die 50 may comprise a plurality of devices such as a vertical MISFET and a diode, or alternatively two MISFET devices separated by an isolation region.

The thickness of the die 50 may be from the top surface to the opposite bottom surface may be less than 50 μm in various embodiments. The thickness of the die 50 from the top surface to the bottom surface may be less than 20 μm in one or more embodiments. The thickness of the die 50 from the top surface to the bottom surface may be less than 10 μm in one or more embodiments.

Referring to FIG. 11, the die 50 is placed over a lead frame 10. The die 50 may be attached to the lead frame 10 using a first adhesive layer 30, which may be insulating in one embodiment. In some embodiments, the first adhesive layer 30 may be conductive, for example, may comprise a nano-conductive paste. In alternative embodiments, the first adhesive layer 30 is a solderable material.

In one embodiment, the first adhesive layer 30 comprises a polymer such as a cyanide ester or epoxy material and may comprise silver particles. In one embodiment, the first adhesive layer 30 may be applied as conductive particles in a polymer matrix so as to form a composite material after curing. In an alternative embodiment, a conductive nano-paste such as a silver nano-paste may be applied. Alternatively, in another embodiment, the first adhesive layer 30 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the die attach layer 280.

The first adhesive layer 30 may be dispensed in controlled quantities under the die 50. A first adhesive layer 30 having a polymer may be cured at about 125° C. to about 200° C. while a solder based first adhesive layer 30 may be cured at 250° C. to about 350° C. Using the first adhesive layer 30, the die 50 is attached to the die paddle of the leadframe 10.

Figure 12:
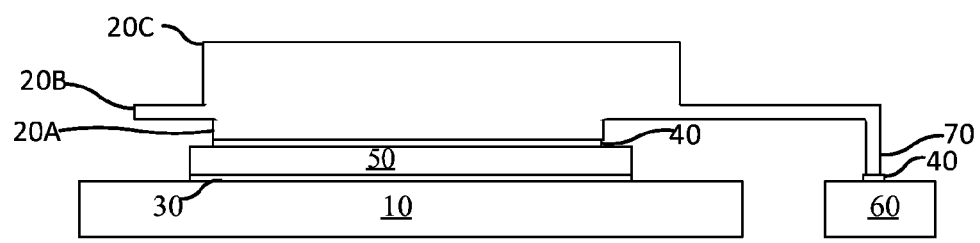
FIG. 12 illustrates a semiconductor package during fabrication after attaching a clip in accordance with an embodiment of the present invention.

FIG. 12 illustrates a semiconductor package during fabrication after attaching a clip in accordance with an embodiment of the present invention.

Referring to FIG. 12, the clip 20 is attached to a pad on the die 50. A second adhesive layer 40 may be formed over the die 50 and the clip 20 may be attached to the die 50 using the second adhesive layer 40. Using the second adhesive layer 40, the die 50 is attached to a first portion 20A of the clip 20. Referring to FIG. 12, the second portion 20B of the clip 20 may be attached using another portion of the second adhesive layer 40. In various embodiments, the second adhesive layer 40 may be formed similar to the first adhesive layer 30.

In one or more embodiments, the second adhesive layer 40 may be an electrically conductive adhesive layer. In other embodiments, the second adhesive layer 40 may be a soft solder or a nano die attach. In one embodiment, the second adhesive layer 40 comprises a polymer such as a cyanide ester or epoxy material and may comprise silver particles. In one embodiment, the second adhesive layer 40 may be applied as conductive particles in a polymer matrix so as to form a composite material after curing. In an alternative embodiment, a conductive nano-paste such as a silver nano-paste may be applied. Alternatively, in another embodiment, the second adhesive layer 40 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the second adhesive layer 40. The second adhesive layer 40 having a polymer may be cured at about 125° C. to about 200° C. while solder based second adhesive layer 40 may be cured at 250° C. to about 350° C.

In one or more embodiments, other contact pads on the die 50 are coupled to the lead frame 10 using wire bonds using a wire bonding process (FIG. 5A). The wire bonds may be soldered to the leads 60 of the leadframe 10 and the contact pads using solder balls. In one or more embodiments, high-speed wire bond equipment may be used to minimize the time of forming the wire bonds. Image recognition systems may be used to orient the die 50 during the wire bonding process in some embodiments.

Figure 13:
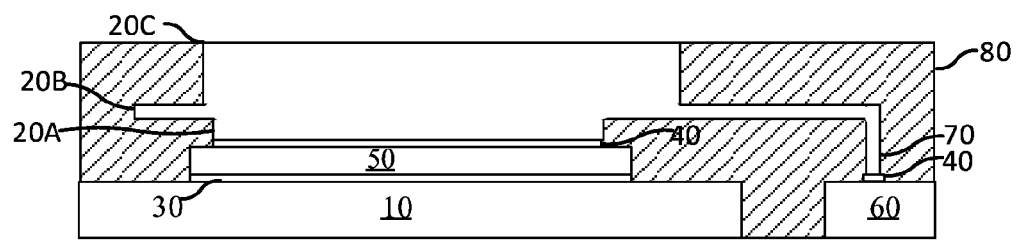
FIG. 13 illustrates a semiconductor package after forming an encapsulant layer around the die in accordance with an embodiment of the present invention.

FIG. 13 illustrates a semiconductor package after forming a protective encapsulant layer around the die in accordance with an embodiment of the present invention.

Referring to FIG. 13, an encapsulating material 80 is deposited over the clip 20, the die 50, and the lead frame 10. In various embodiments, the encapsulating material 80 is coated over the entire clip 20, the die 50, and the lead frame 10. The die 50 is thus embedded within the encapsulating material 80. In one embodiment, the encapsulating material 80 is applied using a compression molding process. In compression molding, the encapsulating material 80 may be placed into a molding cavity, then the molding cavity is closed to compress the encapsulating material 80. Compression molding may be used when a single pattern is being molded. In an alternative embodiment, the encapsulating material 80 is applied using a transfer molding process.

In other embodiments, the encapsulating material 80 may be applied using injection molding, granulate molding, powder molding, or liquid molding. Alternatively, the encapsulating material 80 may be applied using printing processes such as stencil or screen printing.

In various embodiments, the encapsulating material 80 comprises a dielectric material and may comprise a mold compound in one embodiment. In other embodiments, the encapsulating material 80 may comprise a polymer, a biopolymer, a fiber impregnated polymer (e.g., carbon or glass fibers in a resin), a particle filled polymer, and other organic materials. In one or more embodiments, the encapsulating material 80 comprises a sealant not formed using a mold compound, and materials such as epoxy resins and/or silicones. In various embodiments, the encapsulating material 80 may be made of any appropriate duroplastic, thermoplastic, or thermosetting material, or a laminate. The material of the encapsulating material 80 may include filler materials in some embodiments. In one embodiment, the encapsulating material 80 may comprise epoxy material and a fill material comprising small particles of glass or other electrically insulating mineral filler materials like alumina or organic fill materials.

The encapsulating material 80 may be cured, i.e., subjected to a thermal process to harden thus forming a hermetic seal protecting the die 50, the first and the second adhesive layers 30 and 40, the clip 20, and the lead frame 10.

Figure 14A:
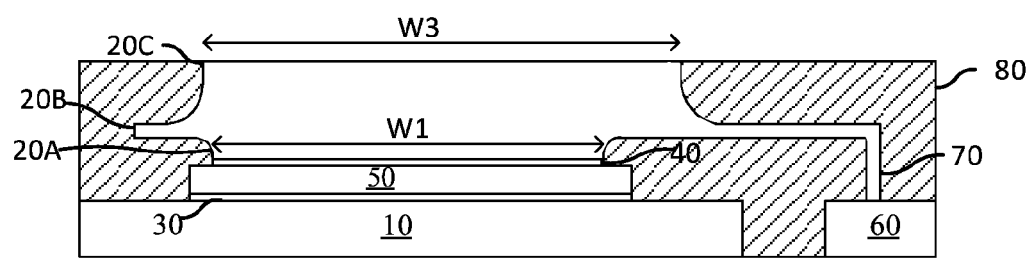
FIGS. 14A and 14B, illustrates a semiconductor package after forming an encapsulant layer around the die in accordance with an alternative embodiment of the present invention.
Figure 14B:
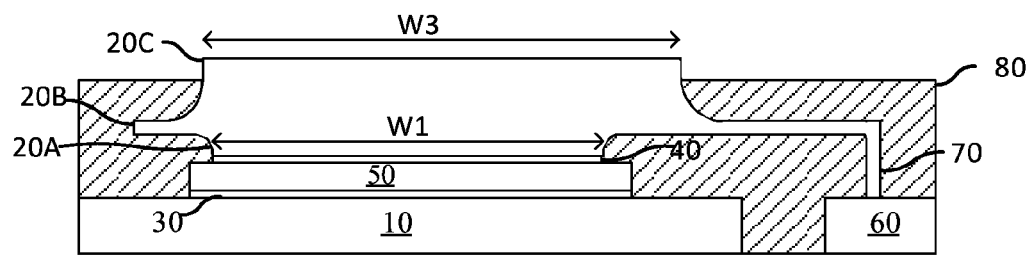

FIG. 14, which includes FIGS. 14A and 14B, illustrates a semiconductor package after forming a protective encapsulant layer around the die in accordance with an alternative embodiment of the present invention.

In this embodiment, for example, as illustrated in FIG. 14A, the etching processed used to form the clip 20 form concave surfaces. As a consequence, the first portion 20A and the third portion 20C include concave sidewalls. For example, the third width W3 increases from the top surface of the clip 20 towards the second portion 20B. Similarly, the first width W1 increases from the bottom surface of the clip 20 towards the second portion 20B.

FIG. 14B illustrates a further embodiment comprising a protruding heat sink portion. In this embodiment, a part of the third portion 20C protrudes out of the package. This embodiment may further amplify the heat sinking ability of the clip 20 because the third portion 20C may be coupled to another bigger heat sink structure, which can extract heat away from the top surface as well as the exposed sidewalls of the third portion 20C. Alternatively, the exposed sidewalls may be cooled, e.g., by an external fan more effectively.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-13 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a lead frame comprising a die paddle and a first lead;
a chip disposed over the die paddle of the lead frame; and
a clip disposed over the chip, the clip coupling a first pad on the chip to the first lead of the lead frame, the clip comprising a clip substrate comprising a first portion, a second portion, a third portion, and a recess,
wherein the first portion includes a first contact surface coupling the first pad,
wherein the second portion includes a substantially vertical connection region and a substantially planar connection region, the substantially vertical connection region having a second contact surface coupling the first lead, wherein the substantially planar connection region of the second portion of the clip substrate comprises a first section, a second section, and a third section,
wherein the recess is disposed in the clip substrate and separates the substantially vertical connection region from the first portion, wherein the first section is disposed above the first lead and a portion of the recess, wherein the second section is disposed directly beneath the third portion of the clip substrate, and wherein the third section extends away from the first section and the second section, and
wherein the third portion includes a heat sink, wherein the second portion is disposed between the first portion and the third portion, wherein the recess overlaps with the third portion, and wherein the first portion, the second portion and the third portion are part of a same base material; and
an encapsulant surrounding the clip, wherein a top surface of the third portion is not covered by the encapsulant, and wherein a top surface of the third portion is about coplanar with a top surface of the encapsulant so as to expose the top surface of the third portion, wherein the base material of the third portion extends continuously from the exposed top surface of the third portion to an opposite bottom surface facing the chip.

2. The device of claim 1, wherein the first portion has a first width, the second portion has a second width, the third portion has a third width, wherein the first, the second, and third widths are measured in a direction parallel to a major surface of the chip.

3. The device of claim 1, wherein the first portion has a first thickness, the second portion has a second thickness, the third portion has a third thickness, wherein the first, the second, and third thicknesses are measured in a direction perpendicular to a major surface of the chip, wherein the second portion is above the first portion and the third portion is above the second portion, and wherein the third thickness is larger than the first thickness and the second thickness.

4. The device of claim 1, wherein the clip comprises copper.

5. The device of claim 1, further comprising an interconnect coupling second pad of the chip with a second lead of the lead frame.

6. The device of claim 5, wherein the second pad is a gate contact, and wherein the first pad is a source contact.

7. The device of claim 5, wherein the interconnect comprises another clip, and wherein the another clip does not comprise a heat sink and is embedded within the encapsulant.

8. The device of claim 1, further comprising a conductive layer disposed between the chip and the clip.

9. The device of claim 1, further comprising a conductive layer disposed between the chip and the die paddle.

10. A semiconductor device comprising:
a lead frame comprising a die paddle and a first lead;
a chip disposed over the die paddle of the lead frame;
a clip disposed over the chip, the clip coupled to the first lead and to a first pad of the chip, the clip comprising a clip substrate comprising a first portion having a first width, a second portion having a second width, a third portion having a third width, and a recess, the second portion being above the first portion, the third portion being above the second portion, wherein the first portion comprises a contact surface for coupling to the chip, wherein the second portion comprises a substantially vertical connection region and a substantially planar connection region, the substantially vertical connection region having a second contact surface for coupling to the first lead, wherein the recess is disposed in the clip substrate and separates the substantially vertical connection region from the first portion, and wherein the third portion comprises a heat sink, wherein the second portion is disposed between the first portion and the third portion, wherein the recess overlaps with the third portion, and wherein the first portion, the second portion, and the third portion are part of a same base material, wherein the first portion changes to the second portion along a first sidewall surface comprising a first concave shape, and wherein the second portion changes to the third portion along a second sidewall surface comprising a second concave shape, wherein the first concave shape and the second concave shape are oriented differently relative to each other; and an encapsulant surrounding the clip, wherein a top surface of the third portion is not covered by the encapsulant, and wherein a top surface of the third portion is about coplanar with a top surface of the encapsulant so as to expose the top surface of the third portion, wherein the base material of the third portion extends without interruption by another layer from the exposed top surface of the third portion to an opposite bottom surface facing the chip.

11. The device of claim 10, wherein the second width is larger than the first width and the third width.

12. The device of claim 10, wherein the first portion comprises a first thickness, the second portion comprises a second thickness, and the third portion comprises a third thickness, wherein the third thickness is larger than the first thickness and the second thickness, and wherein the first, the second, and third thicknesses are measured in a direction perpendicular to a major surface of the chip.

13. The device of claim 10, wherein the first, the second, and third widths are measured in a direction parallel to a major surface of the chip.

14. The device of claim 10, wherein the clip comprises copper.

15. The device of claim 10, wherein the first portion is coupled to the first pad of the chip, and wherein the second portion is coupled to the first lead of the lead frame.

16. The device of claim 10, further comprising an interconnect coupling second pad of the chip with a second lead of the lead frame.

17. The device of claim 16, wherein the second pad is a gate contact, and wherein the first pad is a source contact.

18. The device of claim 16, wherein the interconnect comprises another clip or a wire bond.

19. The device of claim 10, wherein a sidewall of the third portion is not covered by the encapsulant.

20. A method of forming a semiconductor device, the method comprising:

forming a clip by structuring a base material, wherein structuring the base material comprises after forming a first etch mask at a first side of the base material, etching the base material from the first side to form a first portion, and after forming a second etch mask at a second side opposite the first side of the base material, etching the base material from the second side to form a third portion comprising a heat sink;

attaching the clip to a chip, the first side facing the chip; and attaching the chip and the clip to a lead frame; and encapsulating the chip and the clip in a encapsulant, wherein a top surface of the heat sink remains exposed after the encapsulating.

21. The method of claim 20, further comprising stamping the clip after structuring the base material.

22. The method of claim 20, wherein attaching the clip to the chip comprises soldering the clip to the chip.

23. The method of claim 20, wherein the clip comprises a first portion having a first width, a second portion having a second width, and a third portion having a third width, wherein the second portion is disposed above the first portion and the third portion is disposed above the second portion, and wherein the first, the second, and third widths are measured in a direction parallel to a major surface of the chip.

24. The method of claim 20, wherein the clip comprises a first portion having a first thickness, a second portion having a second thickness, a third portion having a third thickness, wherein the first, the second, and third thicknesses are measured in a direction perpendicular to a major surface of the chip, wherein the second portion is above the first portion and the third portion is above the second portion, and wherein the third thickness is larger than the first thickness and the second thickness.

* * * * *